(12) United States Patent
Chyan

(10) Patent No.: US 7,737,541 B2
(45) Date of Patent: Jun. 15, 2010

(54) SEMICONDUCTOR CHIP PACKAGE STRUCTURE

(75) Inventor: Yu-Wei Chyan, Hsinchu (TW)

(73) Assignee: Silicon Motion, Inc., Hsinchu County (TW)

( * ) Notice: Subject to any disclaimer, the term of this patent is extended or adjusted under 35 U.S.C. 154(b) by 105 days.

(21) Appl. No.: 12/264,983

(22) Filed: Nov. 5, 2008

(65) Prior Publication Data

US 2009/0283918 A1 Nov. 19, 2009

(30) Foreign Application Priority Data

May 13, 2008 (TW) .............................. 97208277 U

(51) Int. Cl.
*H01L 23/485* (2006.01)
(52) U.S. Cl. ................................. 257/686; 257/E23.02
(58) Field of Classification Search ................ 257/686, 257/E23.02; 438/107–109
See application file for complete search history.

(56) References Cited

U.S. PATENT DOCUMENTS

2008/0237645 A1* 10/2008 Uchino ....................... 257/203

\* cited by examiner

*Primary Examiner*—W. David Coleman
*Assistant Examiner*—Daniel Shook
(74) *Attorney, Agent, or Firm*—Thomas, Kayden, Horstemeyer & Risley

(57) ABSTRACT

A semiconductor chip package structure is described. The semiconductor chip package structure comprises a first chip, which is operated through a first power connection, having a central region and a marginal region. The first chip comprises a plurality of first and second power bonding pads disposed in a marginal region on the top of the first chip. A first power ring and a second power ring are disposed on the first chip, wherein the first and second power rings are respectively electrically connected to the first and second power bonding pads. A second chip, which is operated through a second power connection, is mounted on the central region of the first chip, wherein the second chip comprises a plurality of power bonding pads thereon. A plurality of second bonding wires are electrically connected to the power bonding pads and the second power bonding pads, respectively.

12 Claims, 5 Drawing Sheets

SEMICONDUCTOR CHIP PACKAGE STRUCTURE

CROSS REFERENCE TO RELATED APPLICATIONS

This Application claims priority of Taiwan Patent Application No. 97208277, filed on May 13, 2008, the entirety of which is incorporated by reference herein.

BACKGROUND OF THE INVENTION

1. Field of the Invention

The present invention relates to a semiconductor chip package structure, and more particularly, relates to a multi-chip package structure with multiple power connections.

2. Description of the Related Art

Due to the demand for small, lightweight and powerful electronic products, demand for multi-chip package (MCP) semiconductor chip package structures, to achieve requirements of multi-function and high performance, have increased. A conventional multi-chip package structure (MCP) integrates different types of semiconductor chips with different operating power requirements, for example, logic chips, analog chips, controller chips or memory chips, in a single chip package structure. Generally, for power requirements of the conventional multi-chip package structures (MCP), multi-power chips and corresponding input/output electrical connections of the package structures, for example, bonding pads or bonding wires, are used to provide different operating powers.

A power net of the conventional multi-chip package structure has a more complex layout because different operating powers are needed for the conventional multi-chip package structure. Therefore, a segment power net has been used, wherein the segment power net is disposed in the conventional multi-chip package structure, electrically connecting to the corresponding bonding pads. Next, the corresponding bonding pads of the conventional multi-chip package structure, is electrically connected to defined pins through a ball grid array (BGA) substrate. For the conventional multi-chip package structure, however, bonding pad positions, which respectively connect to the different operating powers, are fixed because positions of the corresponding segment power net is fixed. Thus, negatively increasing layout area of the bonding pads of the conventional multi-chip package structure. Additionally, using the BGA substrate for the conventional multi-chip package structure results in relatively higher fabrication costs.

Therefore, a novel semiconductor chip package structure with high integrated density and low fabrication costs is desirable.

BRIEF SUMMARY OF INVENTION

A semiconductor chip package structure is provided. An exemplary embodiment of the semiconductor chip package structure comprises a first chip, which is operated through a first power connection, having a central region and a marginal region. The first chip comprises a plurality of first and second power bonding pads disposed in a marginal region on the top of the first chip. A first power ring and a second power ring are disposed in the first chip, wherein the first and second power rings are respectively electrically connected to the first and second power bonding pads. A second chip, which is operated through a second power connection, is mounted on the central region of the first chip, wherein the second chip comprises a plurality of power bonding pads thereon. A plurality of second bonding wires are electrically connected to the power bonding pads and the second power bonding pads, respectively.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
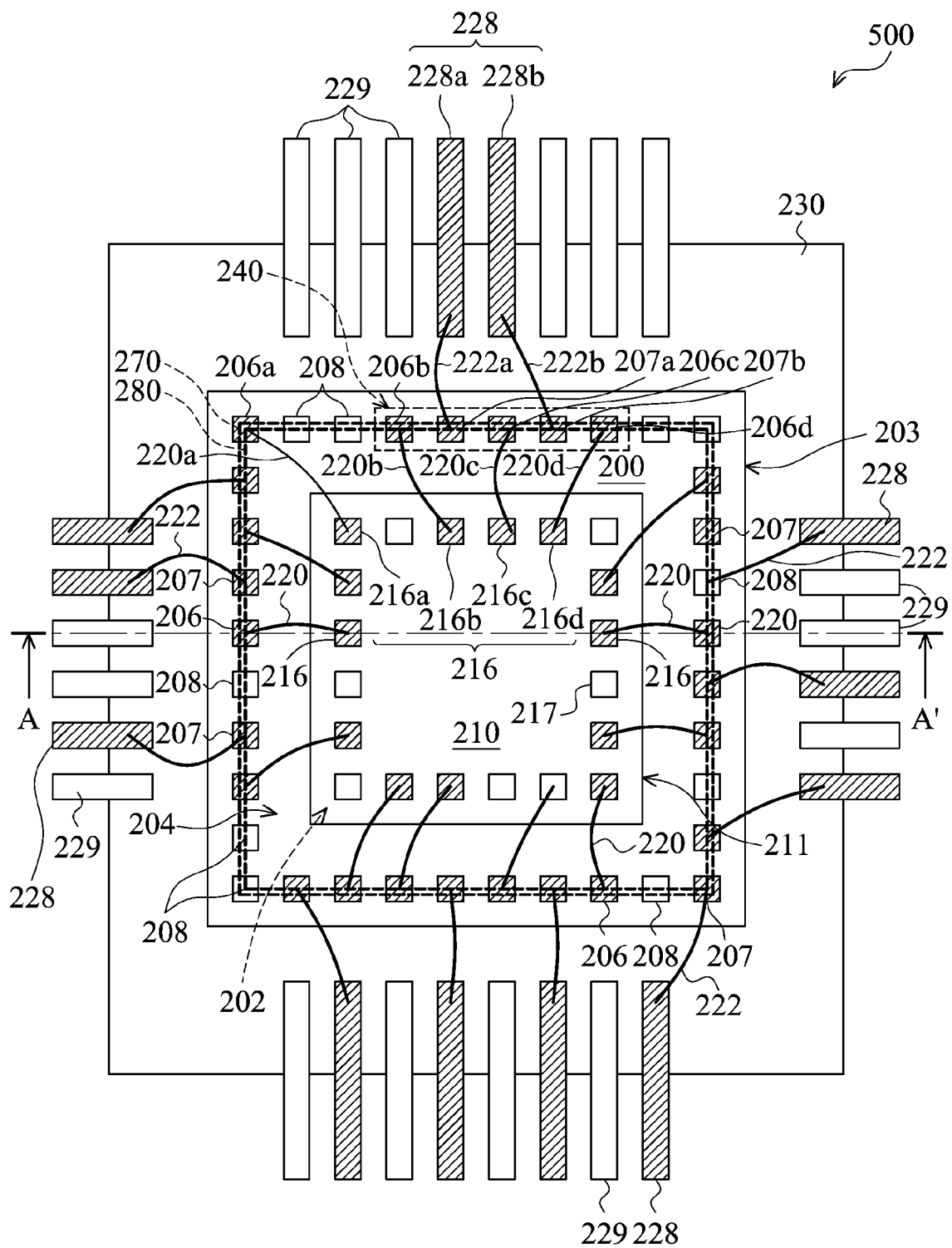
FIG. 1a shows a top view of one exemplary embodiment of a semiconductor chip package structure of the invention.

The following description is of a mode of carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto but is only limited by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Figure 1B:
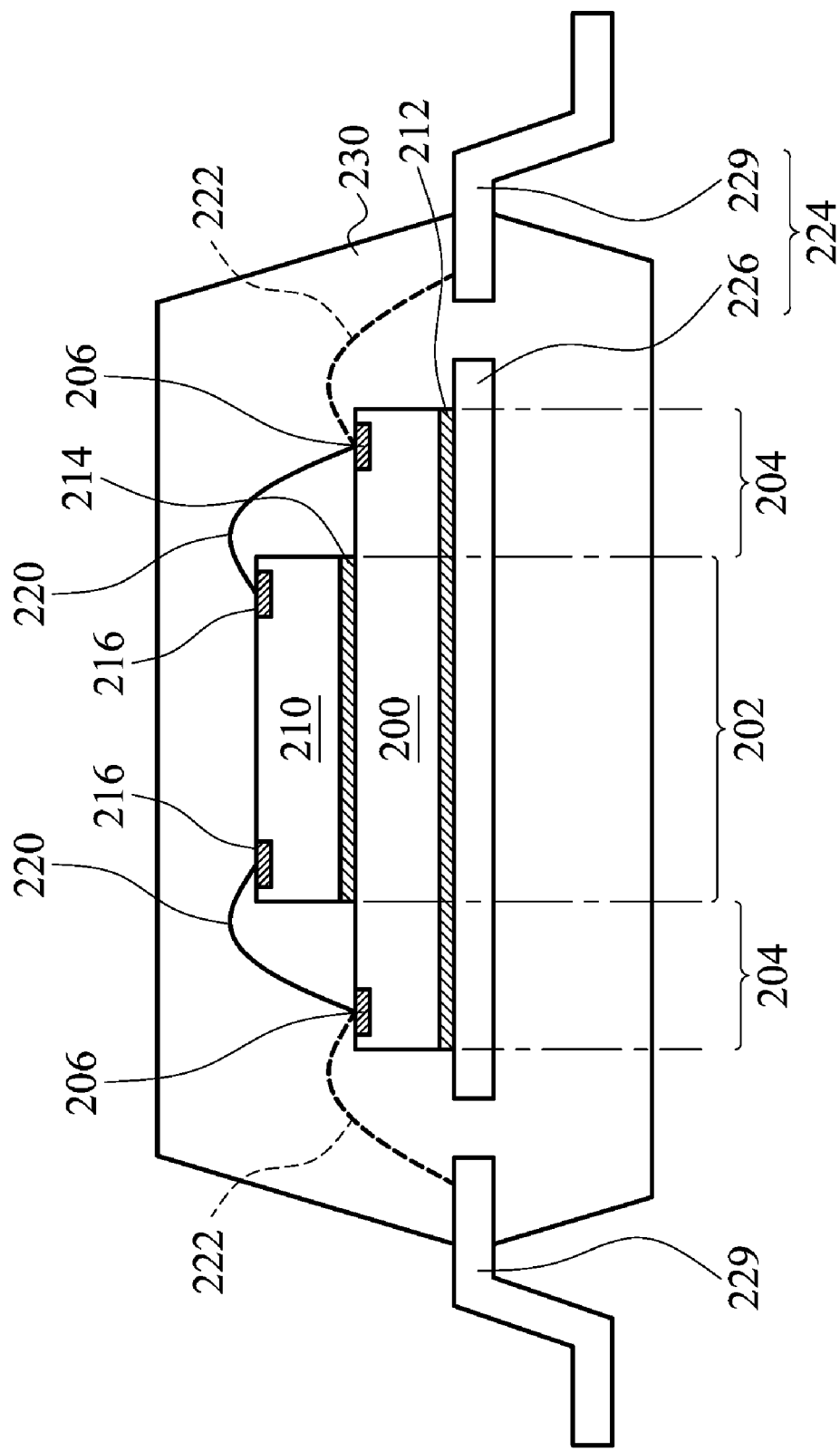
FIG. 1b is a cross section taken along line A-A' of FIG. 1a showing one exemplary embodiment of a semiconductor chip package of the invention.

In accordance with an embodiment of the present invention, embodiments of a semiconductor chip package structure are provided. FIG. 1a shows a top view of one exemplary embodiment of a semiconductor chip package structure 500 of the invention. FIG. 1b is a cross section taken along line A-A' of FIG. 1a showing one exemplary embodiment of a semiconductor chip package 500 of the invention. In one embodiment of the invention, the semiconductor chip package structure 500 may comprise a lead frame based package of multi-chip integration, such as, a quad flat package (QFP). As shown in FIGS. 1a and 1b, the semiconductor chip package structure 500 comprises a lead frame 224 having a chip carrier 226 and a plurality of discrete leads 228 and 229, wherein the leads 228 may serve as power leads 228 providing input/output electrical power connections. A first chip 200 is mounted on the chip carrier 226 by an adhesive material 212, for example, silver paste or epoxy resin. In one embodiment, the first chip 200 may comprise a multi-power chip 200. For example, the first chip 200 may be a chip 200 having level shifter circuits. Generally, an operating power provided to a chip is fixed. The first chip 200 having level shifter circuits may transfer operating power thereof to provide power to other chips or devices operating with different operating powers. The first chip 200 is operated through a first power connection, having a central region 202 and a marginal region 204. The first chip 200 may comprise a plurality of first power bonding pads 207, a plurality of second power bonding pads 206 and a plurality of bonding pads 208, which are disposed in a marginal region 204 on the top of the first chip 200. The first power bonding pads 207, the second power bonding pads 206 and the bonding pads 208 may be arranged in a circular array adjacent to edges 203 of the first chip 200. In one embodiment, the first power bonding pads 207 and the second power bonding pads 206 may serve as input/output electrical power connections of the first chip 200, and the bonding pads 208 may serve as input/output electrical signal or ground connections of the first chip 200. The first chip 200 may comprise a first power ring 270 and a second power ring 280 disposed in the first chip 200. As shown in FIG. 1a, the first power ring 270 and the second power ring 280 are parallel to each other and isolated from each other. In one embodiment, the first power ring 270 and the second power ring 280 are in a position located directly under all the first power bonding pads 207, the second power bonding pads 206 and the bonding pads 208, substantially parallel to an arranged direction of the circular array formed by the bonding pads. Alternatively, the first power ring 270 and the second power ring 280 are in a position located in the marginal region 204, but not directly under all the first power bonding pads 207, the second power bonding pads 206 and the bonding pads 208. The first power ring 270 are electrically connected to each of the first power bonding pads 207, and the second power rings are respectively electrically connected to each of the second power bonding pads 206. Additionally, the first chip 200 may comprise ground paths or signal paths (not shown). A plurality of first bonding wires 222 are electrically connected to the leads 228 and the first power bonding pads 207, respectively. For example, the first bonding wire 222a is electrically connected to the lead 228a and the first power bonding pad 207a. The first bonding wire 222b is electrically connected to the lead 228b and the first power bonding pad 207b.

Additionally, as shown in FIGS. 1a and 1b, the semiconductor chip package structure 500 further comprises a second chip 210, wherein the first chip 300 may have an area larger than that of the second chip 210. In one embodiment, the second chip 210 may comprise a core logic chip 210 operating through a second power connection. The second chip 210 is mount on the central region 202 of the first chip 200 by an adhesive material 214, for example, silver paste or epoxy resin. The second chip 210 may comprise a plurality of power bonding pads 216 and a plurality of bonding pads 217, which are disposed on the top of the second chip 210. The power bonding pads 216 and the bonding pads 217 may be arranged in a circular array adjacent to edges 211 of the second chip 210. In one embodiment, the power bonding pads 216 may serve as input/output electrical power connections of the second chip 210, and the bonding pads 217 may serve as input/output electrical signal or ground connections of the second chip 210. The power bonding pads 216 of the second chip 210 may be respectively electrically connected to the second power bonding pads 206 through the second bonding wires 220. Thus, the first chip 200 may provide power to the second chip 210 through the second power ring 280. For example, the power bonding pad 216a of the second chip 210 is electrically connected to the second power bonding pad 206a through a second bonding wire 220a. The power bonding pad 216b of the second chip 210 is electrically connected to the second power bonding pad 206b through a second bonding wire 220b. The power bonding pad 216c of the second chip 210 is electrically connected to the second power bonding pad 206c through a second bonding wire 220c. The power bonding pad 216d of the second chip 210 is electrically connected to the second power bonding pad 206d through a second bonding wire 220d. In one embodiment, the drawings illustrate input/output electrical power connections of the first and second chips 200 and 210 for convenience only and is not limiting. The input/output electrical signal or ground connections of the first and second chips 200 and 210 are not illustrate herein.

As shown in FIGS. 1a and 1b, the semiconductor chip package structure 500 may further comprise a covering material 230 encapsulating the first chip 200, the second chip 210, the chip carrier 226, inner portion of the leads 228 and 229, the first bonding wires 222 and the second bonding wires 220. In one embodiment, the covering material 230 may comprise polymer materials, for example, epoxy resin.

Figure 2A:
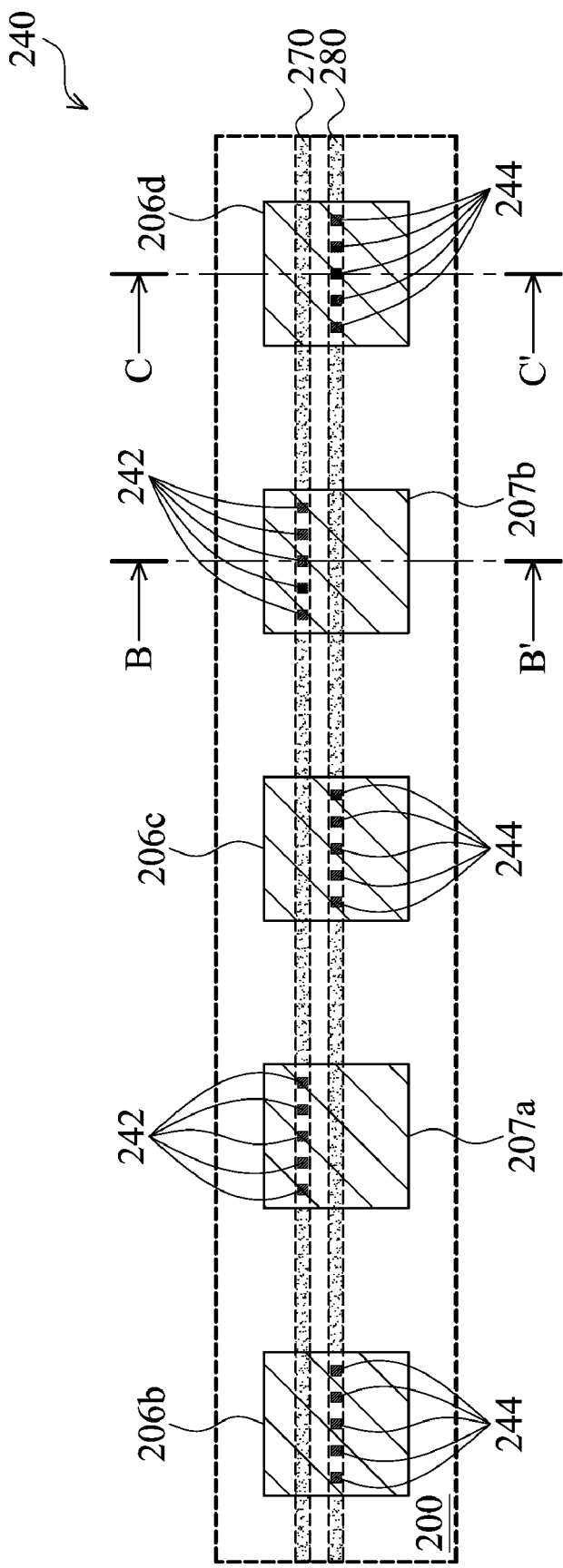
FIG. 2a illustrates an enlarged view of a portion of FIG. 1a showing the electrical connection relationship among the first and second power bonding pads, and first and second power rings of one exemplary embodiment of a semiconductor chip package of the invention.
Figure 2B:
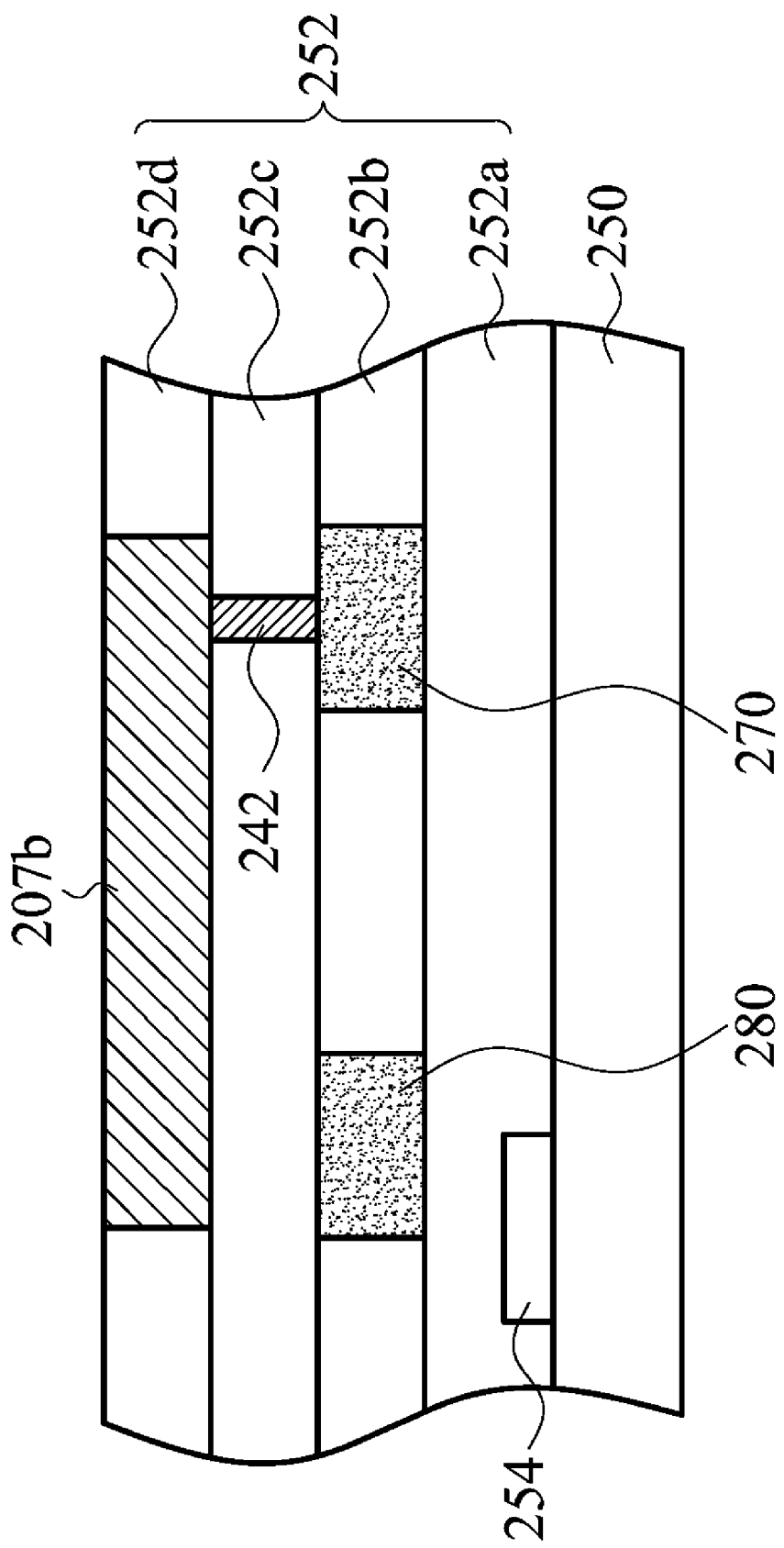
FIG. 2b is a cross section taken along line B-B' of FIG. 2a showing the electrical connection relationship between the first power ring and the first power bonding pad of one exemplary embodiment of a semiconductor chip package of the invention.
Figure 2C:
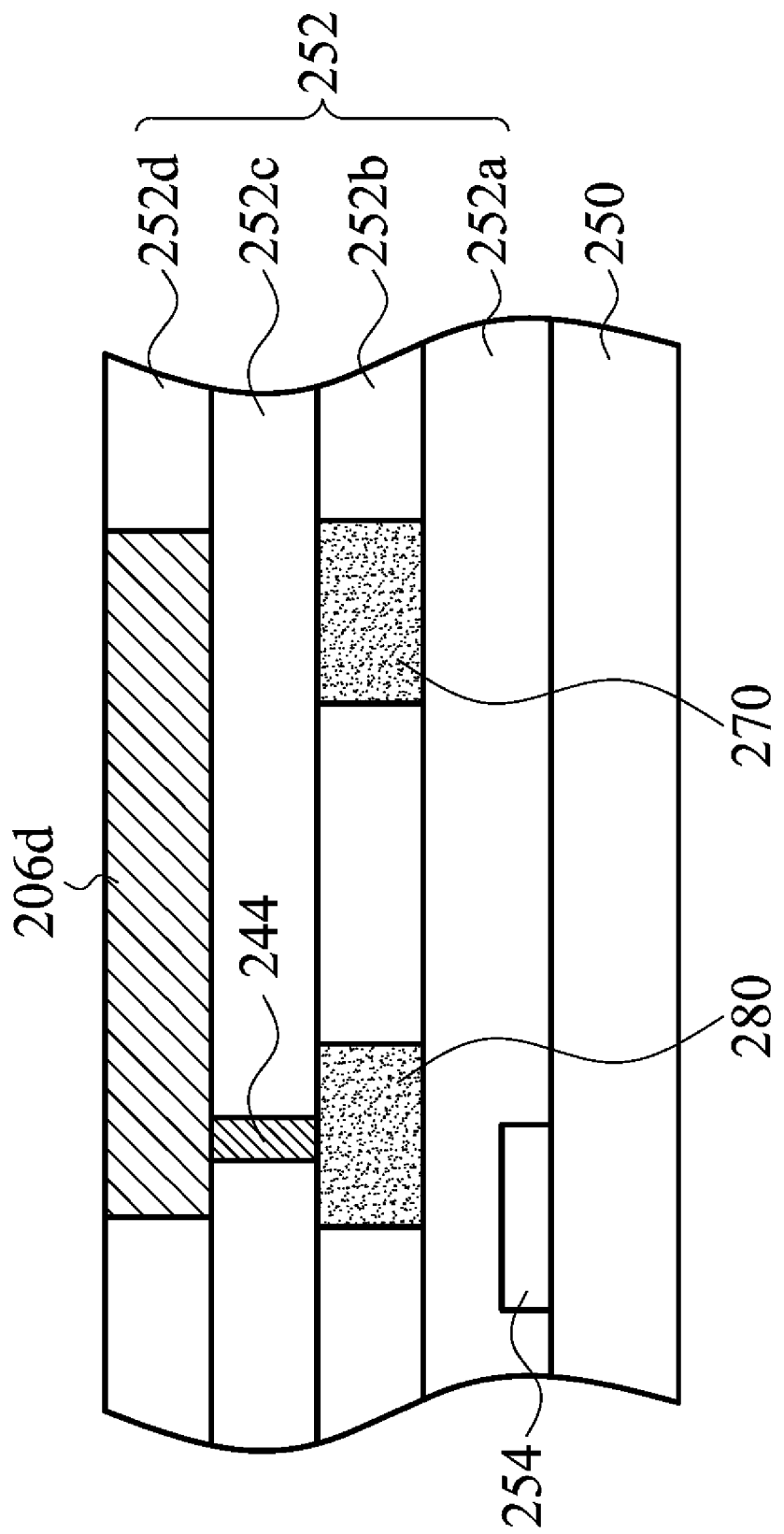
FIG. 2c is a cross section taken along line C-C' of FIG. 2a showing the electrical connection relationship between the second power ring and the second power bonding pad of one exemplary embodiment of a semiconductor chip package of the invention.

FIG. 2a illustrates an enlarged view of a portion of FIG. 1a showing the electrical connection relationship among the first power bonding pads 207a and 207b, the second power bonding pads 206b to 206d, the first power ring 270 and the second power ring 280 of one exemplary embodiment of a semiconductor chip package structure 500 of the invention. FIG. 2b is a cross section taken along line B-B' of FIG. 2a showing the electrical connection relationship between the first power ring 270 and the first power bonding pad 207b of one exemplary embodiment of a semiconductor chip package structure 500 of the invention. FIG. 2c is a cross section taken along line C-C' of FIG. 2a showing the electrical connection relationship between the second power ring 280 and the second power bonding pad 260d of one exemplary embodiment of a semiconductor chip package 500 of the invention. The first bonding wires 222 and the second bonding wires 220 as shown in FIG. 1a are not illustrated herein for convenience only and is not limiting. As shown in FIG. 2a, the first and second power ring 270 and 280 are in a position directly under the first bonding pads 207a and 207b, the second power bonding pads 206b to 206d and the bonding pad 208. The first and second power ring 270 and 280 are substantially parallel to an arranged direction of the first bonding pads 207a and 207b, the second power bonding pads 206b to 206d and the bonding pad 208. As shown in FIGS. 2a to 2c, a plurality of first power connections via plugs 242 are disposed in the first chip 200, wherein the first power bonding pads 207a and 207b are respectively electrically connected to the first power ring 270 through the first power connections via plugs 242. A plurality of second power connections via plugs 244 are disposed in the first chip 200, wherein the second power bonding pads 206b to 206d are respectively electrically connected to the second power ring 280 through the second power connections via plugs 244. As shown in FIGS. 2b and 2c, in one embodiment, the first power ring 270 and the second power ring 280 are disposed on a wafer 250. The first power ring 270 or the second power ring 280 may be electrically connected to a semiconductor device 254 disposed on the wafer 250. Also, the first power ring 270 and the second power ring 280 are disposed in an interconnect structure 252 comprising dielectric layers 252a to 252d. In one embodiment, the first power ring 270 and the second power ring 280 may be disposed in the same dielectric layer, for example, the dielectric layer 252b. Alternatively, the first power ring 270 and the second power ring 280 may be disposed in dielectric layers with different levels (not shown), isolated from each other. As shown in FIG. 2b, the first power ring 270 is electrically connected to the first power bonding pad 207b in the dielectric layer 252d through the first power connections via plug 242. As shown in FIG. 2c, the second power ring 280 is respectively electrically connected to the second power bonding pad 206d in the dielectric layer 252d through the second power connections via plug 244. The electrical connection between the first power ring 270 and the corresponding first power bonding pads 207 or the second power ring 280 and the corresponding second power bonding pads 206 may allow the first power bonding pads 207 and the second power bonding pads 206 to have arbitrary arrangements, which allow for more flexible designs. As shown in FIG. 2a, opposite sides of one of the first power bonding pads 207 along an arranged direction of the circular array, for example, the first power bonding pad 207a, may be adjacent to the second power bonding pads 206b and 26c, respectively. Alternatively, opposite sides of one of the second power bonding pads 206, along an arranged direction of the circular array, for example, the second power bonding pads 206c, may be adjacent to the first power bonding pads 207a and 207b, respectively. The one of the first power bonding pads 207 and one of the second power bonding pads 206 may be disposed alternatively in relation to one another. In other embodiments, any two of the first power bonding pads 207 may be spaced apart by an arbitrary number of the second power bonding pads 206. Alternatively, any two of the second power bonding pads 206 may be spaced apart by an arbitrary number of the first power bonding pads 207. Additionally, number of the power rings with different operating powers and the respective corresponding power bonding pads is according to design, but not limited to the disclosure herein.

In the first chip 200, for example, the multi-power chip 200, a plurality of the parallel power rings with different operating powers may be respectively electrically connected to the power bonding pads with different operating powers through different power connections via plugs to input/output different operating powers, thereby providing power to other chips or devices operating with operating powers different from that of the first chip 200. For example, the first chip 200 may provide the operating power of the second chip 210 operated through a second power connection through the second power ring 280. Therefore, layout area of the power rings can be reduced. The number of input/output electrical connections of the first chip 200 can also be reduced. One exemplary embodiment of the first chip 200 and the second chip 210 may be packaged by a lead frame based semiconductor package structure with lower cost. Due to the fixed nature of the pin assignment of each lead of the lead frame based semiconductor package structure allowed in a design rule, the electrical connection relationship between the second power ring and the second power bonding pad of one exemplary embodiment of a semiconductor chip package of the invention may allow the power bonding pads with different operating powers to have arbitrary arrangements, which allow for more flexible designs, to form the semiconductor chip package structure 500 by the lead frame based semiconductor chip package. Therefore, the semiconductor chip package structure 500 can be a multi-chip semiconductor chip package structure without using a costly ball grid array (BGA) semiconductor chip package structure.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor chip package structure, comprising:
   a first chip, which is operated through a first power connection, having a central region and a marginal region, wherein the first chip comprises:
   a plurality of first and second power bonding pads disposed in a marginal region on the top of the first chip; and
   a first power ring and a second power ring disposed in the first chip, wherein the first and second power rings are respectively electrically connected to the first and second power bonding pads;
   a second chip, which is operated through a second power connection, mounted on the central region of the first chip, wherein the second chip comprises a plurality of power bonding pads thereon; and
   a plurality of second bonding wires electrically connected to the power bonding pads and the second power bonding pads, respectively.

2. The semiconductor chip package structure as claimed in claim 1, further comprising:
   a plurality of first power connections via plugs disposed in the first chip, wherein the first power connections via plugs are respectively electrically connected to the first power bonding pads and the first power ring; and
   a plurality of plugs disposed in the first chip, wherein the second power connections via plugs are respectively electrically connected to the second power bonding pads and the second power ring.

3. The semiconductor chip package structure as claimed in claim 1, further comprising:
   a lead frame having a chip carrier and a plurality of leads, wherein the first chip is mounted on the chip carrier.

4. The semiconductor chip package structure as claimed in claim 1, wherein the first power ring and the second power ring are parallel to each other and isolated from each other.

5. The semiconductor chip package structure as claimed in claim 1, wherein the first power ring and the second power ring are in a position located directly under the first and second power bonding pads.

6. The semiconductor chip package structure as claimed in claim 1, wherein the first and second power bonding pads are arranged in a circular array.

7. The semiconductor chip package structure as claimed in claim 1, wherein the first chip has an area larger than that of the second chip.

8. The semiconductor chip package structure as claimed in claim 3, further comprising:
   a plurality of first bonding wires electrically connected to the leads and the first power bonding pads, respectively.

9. The semiconductor chip package structure as claimed in claim 3, further comprising:
   a covering material encapsulating the first and second chips, the chip carrier, inner portion of the leads, and the first and second bonding wires.

10. The semiconductor chip package structure as claimed in claim 6, wherein opposite sides of one of the first power bonding pads are adjacent to the second power bonding pads, respectively.

11. The semiconductor chip package structure as claimed in claim 6, wherein the opposite sides of one of the second power bonding pads are adjacent to the first power bonding pads, respectively.

12. The semiconductor chip package structure as claimed in claim 6, wherein the one of first power bonding pads and one of second power bonding pads are disposed alternatively in relation to one another.

* * * * *